(12) United States Patent
Kasai

(10) Patent No.: US 12,354,937 B2
(45) Date of Patent: Jul. 8, 2025

(54) SEMICONDUCTOR DEVICE AND PRODUCTION METHOD THEREOF

(71) Applicant: DENSO CORPORATION, Kariya (JP)

(72) Inventor: Takao Kasai, Kariya (JP)

(73) Assignee: DENSO CORPORATION, Kariya (JP)

( * ) Notice: Subject to any disclaimer, the term of this patent is extended or adjusted under 35 U.S.C. 154(b) by 281 days.

(21) Appl. No.: 17/370,770

(22) Filed: Jul. 8, 2021

(65) Prior Publication Data

US 2021/0335700 A1    Oct. 28, 2021

Related U.S. Application Data

(63) Continuation of application No. PCT/JP2019/049879, filed on Dec. 19, 2019.

(30) Foreign Application Priority Data

Jan. 10, 2019   (JP) ................................. 2019-002913

(51) Int. Cl.
*H01L 23/498* (2006.01)
*H01L 21/60* (2006.01)

(52) U.S. Cl.
CPC ........ *H01L 23/49838* (2013.01); *H01L 21/60* (2021.08); *H01L 23/49811* (2013.01); *H01L 2021/60007* (2013.01)

(58) Field of Classification Search
CPC ................. H01L 23/49838; H01L 23/49811
See application file for complete search history.

(56) References Cited

U.S. PATENT DOCUMENTS 6,060,780 A    5/2000   Ohta et al.
9,425,159 B2 *  8/2016   Terui ...................... H01L 24/19
(Continued)

FOREIGN PATENT DOCUMENTS

DE    102011017543 A1    11/2011
JP    H06-007272 U        1/1994
(Continued)

*Primary Examiner* — Michele Fan
(74) *Attorney, Agent, or Firm* — Maschoff Brennan

(57) ABSTRACT

A semiconductor device includes a semiconductor package equipped with a plurality of electrodes and a mount member which is equipped with a plurality of lands and on which the semiconductor package is mounted. The semiconductor package has the electrodes joined to the lands through solders. One of the electrodes is designed as a position/orientation control electrode for the semiconductor package. One of the lands is designed as a position/orientation control land for the semiconductor package. The position/orientation control land is arranged inside the position/orientation control electrode in a planar view thereof and includes a plurality of first extensions which extend in different radial directions about the center of the semiconductor package. The position/orientation control electrode includes a plurality of second extensions which extend along the first extensions. Each of the first extension has an outer portion which is located outside an outer line of a facing one of the second extensions. The outer portions are arranged to be symmetrical with respect to the center of the semiconductor package.

14 Claims, 8 Drawing Sheets

(56) References Cited

U.S. PATENT DOCUMENTS

| | | | |
|---|---|---|---|
| 2002/0112348 A1* | 8/2002 | Inoue | H05K 3/3485 |
| | | | 29/854 |
| 2007/0223206 A1 | 9/2007 | Ogawa | |
| 2010/0258341 A1 | 10/2010 | Sagawa et al. | |
| 2011/0221303 A1* | 9/2011 | Chiba | H03H 9/0542 |
| | | | 310/313 R |
| 2016/0233180 A1 | 8/2016 | Walker | |
| 2018/0092211 A1 | 3/2018 | Minegishi | |
| 2019/0029115 A1* | 1/2019 | Fujimura | H05K 3/3436 |

FOREIGN PATENT DOCUMENTS

| | | | |
|---|---|---|---|
| JP | 11017319 A * | 1/1999 | |
| JP | H11-017319 A | 1/1999 | |
| JP | 2001-156432 A | 6/2001 | |
| JP | 2001196731 A * | 7/2001 | |
| JP | 2002-223062 A | 8/2002 | |
| JP | 2008070200 A * | 3/2008 | |

* cited by examiner

SEMICONDUCTOR DEVICE AND PRODUCTION METHOD THEREOF

CROSS REFERENCE TO RELATED DOCUMENT

The present application claims the benefit of priority of Japanese Patent Application No. 2019-2913 filed on Jan. 10, 2019, the disclosure of which is incorporated herein by reference.

TECHNICAL FIELD

This disclosure generally relates to a semiconductor device configured to have mounted thereon using solder a semiconductor package which is equipped with a plurality of electrodes and also relates to a production method thereof.

BACKGROUND ART

Typical semiconductor devices in which a semiconductor package equipped with a plurality of electrodes is joined through solder to a printed circuit board on which lands are fabricated face a risk that the semiconductor package may be mounted with the electrodes positionally misaligned with the lands. Such position-misalignment causes the semiconductor package to be joined to the printed circuit board at an incorrect location, which results in a factor causing a malfunction of the semiconductor.

A phenomenon is known in which the position-misalignment of the electrodes of the semiconductor package with the lands on the printed circuit board may be corrected by the surface tension of solder melted upon joint of the electrodes to the lands to move the semiconductor package toward the locations of the lands. Such a phenomenon is usually called self-alignment. Patent literature 1 teaches a printed circuit board which uses self-alignment to control an error in position of a semiconductor package. Specifically, the printed circuit board is equipped with a plurality of lands joined each to one of electrodes protruding from the semiconductor package. Two or more of the lands which correspond to two of more of the electrodes which are arranged on an edge of the semiconductor package are shaped to have an area larger than that of the other lands. In other words, the lands of the printed circuit board include large-sized lands and small-sized lands.

The above arrangements realize the printed circuit board which is capable of mounting thereon the semiconductor package equipped with the plurality of electrodes arranged at a short interval away from each other and increasing the volume of solder on the large-sized lands to achieve the self-alignment.

PRIOR ART DOCUMENT

Patent Literature

Patent Literature 1
  Japanese Utility Model First Publication No. 06-007272

SUMMARY OF THE INVENTION

In recent years, the size of semiconductors is being decreased with the downsizing of electronic devices. This results in an increase in use of SON (Small Outline Non-Lead) structures or QFN (Quad Flat Non-lead) structures which are equipped with no electrodes protruding outside an outline of a package. Such types of semiconductor packages have a drawback in that after the semiconductor package is jointed to a printed circuit board using solder, stress exerted on the solder which arises from a difference in linear expansivity between the semiconductor package and the printed circuit board may result in a decrease in ability of the electrodes to reduce the stress, thereby leading to insufficient reliability of the joint between the semiconductor package and the printed circuit board.

Securing the reliability of the soldered joint may be achieved by increasing the volume of the solder to release the stress, but however, it may result in a risk that when a portion of the solder moves out of the lands and is separated from the body of the solder upon mounting of the semiconductor package on the circuit board, it may become a solder ball which leads to other electrical defects. The above method may also cause the semiconductor package to move significantly until the melted solder is hardened again, which leads to a shift in position and orientation of the semiconductor package after mounted on the circuit board (which will also be referred to as mount position/orientation).

"The shift or error in mount position/orientation", as referred to herein, means at least one of undesirable inclination of the semiconductor package relative to a surface of a mount member, such as a substrate, on which the semiconductor package is mounted and position misalignment between the electrodes and the mount member.

The above shift in mount position/orientation of the semiconductor package may result in an unwanted factor causing a reduction in measurement accuracy of a sensor which is installed in a semiconductor device and works to output a signal as a function of a physical quantity, such as acceleration or angular velocity, acting on the sensor. A semiconductor device made up of a semiconductor package of a QFN structure and a printed circuit board, as taught in the above patent literature 1 is, therefore, capable of eliminating a positional misalignment between the electrodes and the lands by means of the self-alignment, but encounters a difficulty in eliminating an error of the mount position/orientation.

It is an object of this disclosure to provide a semiconductor device on which a semiconductor package equipped with a plurality of electrodes is mounted through solder and which ensures a required position and orientation of the semiconductor package mounted on the semiconductor device and also ensures reliability of solder joints of the semiconductor package, and also to provide a production method of such a semiconductor device.

According to the first aspect of this disclosure in order to achieve the above object, there is provided a semiconductor device which comprises: (a) a semiconductor package which is equipped with a plurality of electrodes; and (b) a mount member which is equipped with a plurality of lands and on which the semiconductor package is mounted. The semiconductor package has the electrodes joined to the lands through solders. At least two of the electrodes work as position/orientation control electrodes to control a position and orientation of the semiconductor package relative to a mount surface that is a surface of the mount member which faces the semiconductor package. At least two of the lands work as position/orientation control lands to control the position and orientation of the semiconductor package relative to the mount surface of the mount member. Each of the position/orientation control electrodes is arranged in a planar view thereof to overlap a respective one of the position/orientation control lands and has a center thereof offset from a center of the one of the position/orientation control lands which is joined to the position/orientation control electrode through the solder. The number of position/orientation control lands and the number of position/orientation control electrodes are plural. Each of the position/orientation control lands and one of the position/orientation control lands which are joined together through one of the solders are defined as a position/orientation control pair. The position/orientation control pairs are arranged to be symmetrical with respect to a center of the semiconductor package in a planar view thereof.

The above arrangements realize a structure in which the semiconductor package is mounted on the substrate and which has the plurality of position/orientation control pairs which are made of the position/orientation control electrodes and position/orientation control lands joined to the position/orientation control electrodes through the solders and arranged to be symmetrical with respect to the center of the semiconductor package in a planar view thereof. The position/orientation control pairs define regions where surface tension vectors are produced which are vectors of forces arising from surface tensions of the solders which are melted when the position/orientation control electrodes and position/orientation control lands are joined together and become wet and expand on the position/orientation control pairs. The symmetrical layout of the position/orientation control pairs about the center of the semiconductor package in the planar view will cause the surface tension vectors, as produced upon the solder joint, to cancel each other. This results in the semiconductor package being held from being unintentionally moved and mounted on the substrate as much as the volume of the solders is increased, thereby ensuring a required mount position/orientation of the semiconductor package and the reliability of the solder joints.

According to the second aspect of this disclosure, there is provided a semiconductor device which comprises: (a) a semiconductor package which is equipped with a plurality of electrodes; and (b) a mount member which is equipped with a plurality of lands and on which the semiconductor package is mounted. The semiconductor package has the electrodes joined to the lands through solders. One of the electrodes works as a position/orientation control electrode to control a position and orientation of the semiconductor package relative to a mount surface that is a surface of the mount member which faces the semiconductor package. One of the lands works as a position/orientation control land to control the position and orientation of the semiconductor package relative to the mount surface of the mount member. The position/orientation control land is larger in planar size than the position/orientation control electrode and occupies the position/orientation control electrode inside the position/orientation control land in a planar view thereof. The position/orientation control land includes a plurality of extensions extending in a radial direction from a center of the semiconductor package. The plurality of extensions extend in directions different from each other. The extensions of the position/orientation control land are defined as first extensions. The position/orientation control electrode includes a plurality of second extensions which extend along the first extensions. Each of the first extensions has an outer portion arranged outside an outline of one of the second extensions each of the first extensions faces. The outer portions are arranged to be symmetrical with respect to a center of the semiconductor package.

The above arrangements realize a structure of the semiconductor device which is equipped with the single position/orientation control electrode and the single position/orientation control land and, like in the above semiconductor device according to the first aspect, ensures a required volume of the solders, but causes the surface tension vectors to be cancelled upon the solder joint. The semiconductor device according to the second aspect, therefore, offers substantially the same beneficial advantages as in the first aspect.

According to the third aspect of this disclosure, there is provided a production method for producing a semiconductor device in which a semiconductor package equipped with a plurality of electrodes is joined using solders to a mount member equipped with a plurality of lands, comprising: (a) preparing the semiconductor package; (b) preparing the mount member; (c) applying the solders to the lands of the mount member; and (d) mounting the semiconductor package on the mount member to which the solders are applied. In the preparation of the semiconductor package, at least two of the electrodes are provided as position/orientation control electrodes to control a position and orientation of the semiconductor package relative to a mount surface that is a surface of the mount member facing the semiconductor package. In the preparation of the mount member, at least two of the lands are provided as position/orientation control lands to control the position and orientation of the semiconductor package relative to the mount surface of the mount member. In the application of the solders, a given portion of each of the position/orientation control lands is exposed outside a corresponding one of the solders. In mounting of semiconductor package on the mount member, the position/orientation control electrodes which are arranged to have centers thereof offset from those of the position/orientation control lands are joined to the position/orientation control lands through the solders. In joining of the semiconductor package to the mount member using the solders, the solders which are melted flow and expand from regions of the position/orientation control lands which are located inside outlines of the position/orientation control lands to regions located outside the outlines of the position/orientation control lands in a planar view thereof. If vectors of forces, as created by surface tensions of the melted solders when flowing and expanding to attract the semiconductor package, are defined as surface tension vectors, the surface tension vectors of the solders applied to the position/orientation control electrodes are totally balanced against each other.

The above arrangements produce the surface tension vectors when the position/orientation control electrodes of the semiconductor package are joined to the position/orientation control lands of the substrate in a process to mount the semiconductor package on the substrate. In such a mounting process, the position/orientation control electrodes are arranged to have centers thereof offset from those of the position/orientation control lands. The position/orientation control lands are also arranged to have portions thereof exposed outside the solders. This causes the solder melted to achieve the joint between the position/orientation control electrodes and the position/orientation control lands to flow to and expand on the exposed portions. If vectors of forces, as created by surface tensions of the melted solders when flowing and expanding to attract the semiconductor package, are defined as surface tension vectors, the surface tension vectors of the solders applied to the position/orientation control electrodes are balanced against each other. This holds the semiconductor package from unintentionally moving until the melted solders are hardened again. This enables the semiconductor device to be produced which is mounted on the substrate in a controlled position and orientation thereof.

Symbols in brackets attached to component parts, as discussed below, are used only to indicate exemplified correspondences between the symbols and the component parts.

MODES FOR CARRYING OUT THE INVENTION

Figure 1:
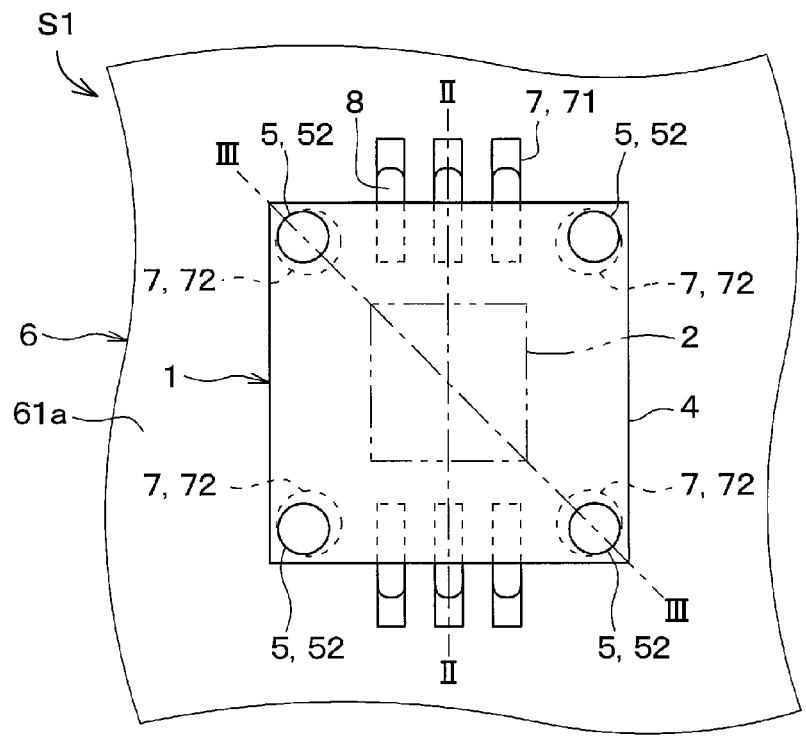
FIG. 1 is a view which illustrates upper surface layout of a semiconductor device according to the first embodiment.

Embodiments of a semiconductor device according to this disclosure will be described below using the drawings. Throughout the following discussion of the embodiments, the same or similar reference numbers will refer to the same or similar parts.

First Embodiment

The Semiconductor Device S1 in the First Embodiment Will be described below with reference to FIGS. 1 to 3. The semiconductor device S1 is preferably used with an electronic device which is installed in, for example, a vehicle, such as an automobile, and equipped with a physical quantity sensor working to output a signal as a function of a physical quantity, such as acceleration or angular velocity, acting on the vehicle. For instance, the semiconductor device S1 may be used in an occupant protection system, such as an airbag, for vehicles which is equipped with an accelerator sensor working to output a signal as a function of a rate of acceleration exerted thereon and requires a high degree of accuracy of the acceleration sensor, but however, may alternatively be employed for another purpose.

For the sake of visibility to facilitate better understanding of structure in FIG. 1, an outline of the semiconductor chip 2, as will be described later, which is invisible from above an upper surface thereof is denoted by a chain double-dashed line. Outlines of portions of the signal lands 71 which are visually covered with the semiconductor package 1 are denoted by broken lines. Similarly, outlines of the auxiliary lands 72 are indicated by broken lines. The auxiliary electrodes 52 are indicated by solid lines. For the same purpose as the above, portions of the solders 8, as will be described later, which are visually covered with the semiconductor package 1 so that they are invisible from above the upper surface of the semiconductor package 1 are omitted from FIG. 1.

Structure

The semiconductor device S1, as illustrated in FIG. 1, includes the semiconductor package 1 equipped with the electrodes 5 and the substrate 6 equipped with the conductive lands 7. The semiconductor package 1 and the substrate 6 are electrically connected using the solders 8. The semiconductor device S1 is configured to have the semiconductor package 1 which extends substantially parallel to a mount surface, i.e., the surface 61a of the substrate 6 facing the semiconductor package 1 and also to have the signal electrodes 51 and the signal lands 71 aligned with each other, as viewed from above the upper surface of the semiconductor device S1.

For the sake of simplicity of explanation, the above described state of the semiconductor package 1 mounted on the substrate 6 will also be referred to as a controlled mount position/orientation.

Figure 2:
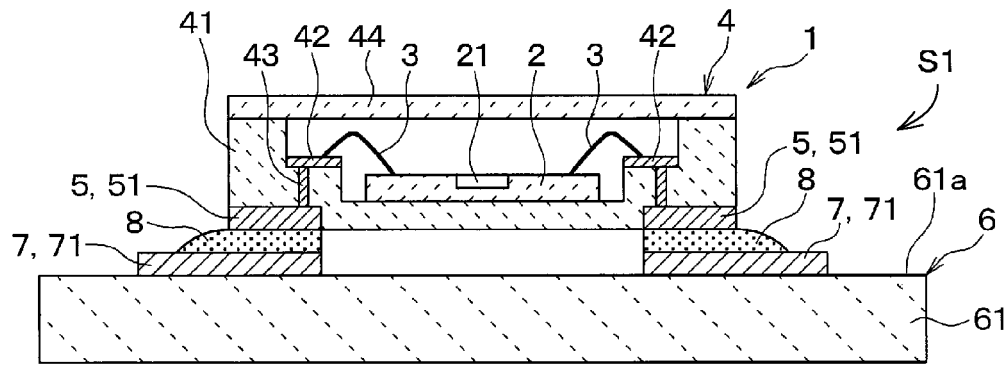
FIG. 2 is a sectional view taken along the line II-II in FIG. 1.
Figure 3:
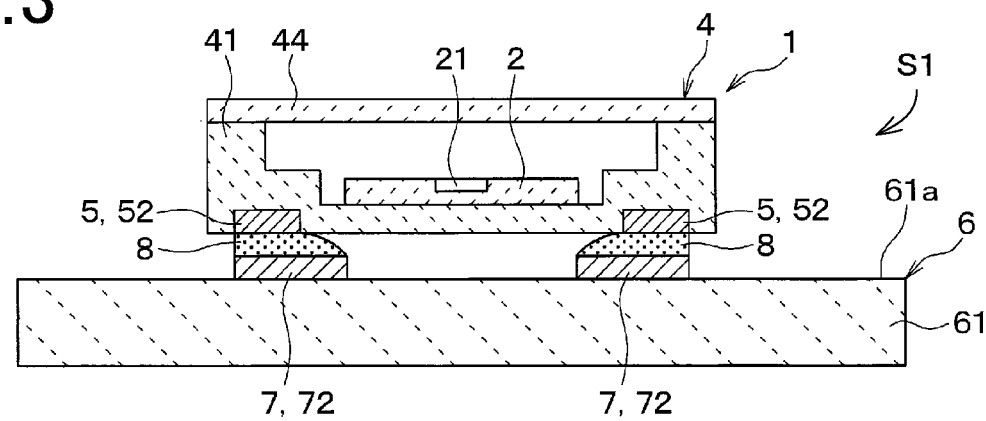
FIG. 3 is a sectional view taken along the line III-III in FIG. 1.

The semiconductor package 1, as can be seen in FIGS. 2 and 3, includes the semiconductor chip 2 equipped with the sensor 21, the housing 4, and the wires 3. The housing 4 has formed therein a recess in which the semiconductor chip 2 is disposed and is equipped with the electrodes 5. The wires 3 electrically connects the semiconductor chip 2 and the housing 4 together. The semiconductor package 1 has the electrodes 51 and 52 arranged inside an outline of the semiconductor package 1, as viewed from above the upper surface of the semiconductor package 1. The semiconductor package 1 is of a SON structure in this embodiment. The semiconductor package 1 is, as can be seen in FIG. 2, designed to have the sensor 21 of the semiconductor chip 2 which is electrically connected through the wires 3, the electrodes 42 and the wire leads 43 to the signal electrodes 51 exposed outside the housing 4 for outputting a signal, as produced by the sensor 21, outside the housing 4.

The semiconductor chip 2 is made mainly from a semiconducting material, such as silicon, and produced in a typical semiconductor manufacturing process. The semiconductor chip 2, as clearly illustrated in FIG. 2, has formed therein the sensor 21 which is sensitive to a physical quantity acting on the semiconductor chip 2 to produce a signal as a function of the physical quantity. The semiconductor chip 2 is, as illustrated in FIG. 2, mounted on a bottom surface of the recess of the housing 4 through die-bonding material, not shown, and electrically connected to the electrodes 42 using the wires 3 within the recess.

FIGS. 2 and 3 exemplify the semiconductor chip 2 which is equipped with the sensor 21, mounted in the recess of the housing 4 using the die-bonding material, and connected through the wires 3 directly to the electrodes 42 formed inside the recess, but however, the semiconductor chip 2 may alternatively be arranged on a circuit chip made of a silicon substrate on which circuit devices are fabricated and connected to the circuit chip using the wires 3. In this case, the circuit chip is connected to the electrodes 42 using wires. The semiconductor chip 2 is connected to the signal electrodes 51. The circuit chip is disposed on the bottom surface of the recess of the housing 4 using die-bonding material, not shown. How to mount the semiconductor chip 2 in the housing 4 or connect the semiconductor chip 2 with the signal electrodes 51 may be altered as needed.

For instance, the sensor 21 is designed to output a signal as a function of a physical quantity, such as acceleration or angular velocity, acting on the sensor 21. The sensor 21 may be configured to have comb-shaped electrodes formed on a movable part functioning as a weight to sense a change in capacitance or to use a piezoresistive device to measure strain resulting from exertion of a physical quantity thereon.

In a case where the sensor 21 of the semiconductor package 1 is designed to output a signal as a function of acceleration acting thereon, the sensor 21 functions as an acceleration sensor. Alternatively, in a case where the sensor 21 is designed to output a signal as a function of angular velocity acting thereon, the sensor 21 functions as an angular velocity sensor. The acceleration sensor or the angular velocity sensor may be of a known structure, and explanation thereof in detail will be omitted here.

The wires 3 are used as connecting members made from metallic material, such as gold, and connected to the electrodes 42 of the semiconductor chip 2 and the housing 4 by means of wire bonding.

The housing 4, as illustrated in FIG. 2, includes the body 41, the electrodes 42, the signal electrodes 51, the auxiliary electrodes 52, the wire leads 43, and the lid 44. The body 41 has a recess in which the semiconductor chip 2 is disposed. The electrodes 42 are formed in the recess of the body 41. The signal electrodes 51 and the auxiliary electrodes 52 are exposed outside the body 41. The wire leads 43 electrically connect between the electrodes 42 and the signal electrodes 51.

The body 41 is made of, for example, ceramic, such as alumina. The body 41 is designed to have the lid 44 soldered thereto to cover the recess and also shroud or protect the semiconductor chip 2 from damage.

The electrodes 5, as can be seen from FIG. 2 or 3, includes the signal electrodes 51 to which a signal is transmitted from the semiconductor chip 2 and the auxiliary electrodes 52 which are not used in transmitting signals. The signal electrodes 51 and the auxiliary electrodes 52 are connected to the conductive lands 7 formed on the substrate 6 through the solders 8.

Each of the plurality of signal electrodes 51 is arranged to have an outline thereof coinciding with a portion of an outline of one of the signal lands 71, as illustrated in FIG. 1, disposed on the substrate 6 and electrically connected, as illustrated in FIG. 2, to a corresponding one of the signal lands 71 through the solder 8. Each of the signal electrodes 51 is made of, for example, a rectangular plate, but may be designed to have another shape. The signal electrodes 51 are, as illustrated in FIG. 1, arranged at a given interval away from each other on an outer circumferential portion of the body 41 of the housing 4, as viewed from above the upper surface of the housing 4.

Each of the plurality of auxiliary electrodes 52 is, as illustrated in FIG. 1, circular in shape in a planar view thereof. The auxiliary electrodes 52 are arranged one on each of four corners of the semiconductor package 1. The auxiliary electrodes 52 are, as clearly illustrated in FIG. 3, connected to the auxiliary lands 72 on the substrate 6 through the solders 8. Each of the auxiliary electrodes 52 is circular in cross section thereof, but may alternatively be designed to have an oval or polygonal shape in cross section.

The auxiliary electrodes 52 in this embodiment are designed as dummy electrodes which function along with the auxiliary lands 72 on the substrate 6 to control the mount position/orientation of the semiconductor package 1 on the substrate 6. The auxiliary electrodes 52 will also be referred to as position/orientation control electrodes. In order to control the mount position/orientation of the semiconductor package 1, the auxiliary electrodes 52 are arranged symmetrically with respect to the center of the semiconductor package 1 in a planar view along with the auxiliary lands 72, as will be described later in detail, overlapping the auxiliary electrodes 52. The reasons for this will be discussed later in explanation of how to produce the semiconductor device S1.

The substrate 6 is, as illustrated in FIG. 2, designed as a wiring substrate which includes the base 61 and the lands 7 on which the semiconductor package 1 is mounted and has formed thereon circuit lines, not shown, connected to the signal lands 71 of the lands 7. The substrate 6 may be designed only to mount the semiconductor package 1 thereon and not to have lands on which electronic devices are mounted as well as the lands 7. The structure of the substrate 6 may be changed as needed.

The substrate 6 is designed as a mount member on which the semiconductor package 1 is supported. This embodiment is described in a case where the mount member is implemented by the substrate 6.

The base 61 is, as illustrated in FIG. 2 or 3, formed in a plate-shape with the surface 61a. The base 61 is made from material, such as glass epoxy resin. The surface 61a of the base 61 has the lands 7 formed thereon.

The lands 7 are made from metallic material, such as copper, and include the signal lands 71 to which the signal electrodes 51 are connected through the solders 8 and the auxiliary lands 72 to which the auxiliary electrodes 52 are connected through the solders 8.

The signal lands 71 are arranged on the surface 61a of the base 61 and electrically connected to the signal electrodes 51 of the semiconductor package 1. The signal lands 71 have connected thereto wire leads to which signals, as outputted from the semiconductor chip 2, are transmitted. Each of the signal lands 71 is made of a quadrangular plate and placed in alignment with a respective one of the signal electrodes 51 of the semiconductor package 1. In this embodiment, the signal lands 71 are, as illustrated in FIG. 1, arranged at a given interval away from each other and oriented to have lengths extending substantially in the same direction, as viewed from above the upper surface of the semiconductor device S1. The layout or number of the signal lands 71 may alternatively be changed depending upon the signal electrodes 51.

Each of the auxiliary lands 72 is paired with one of the auxiliary electrodes 52 of the semiconductor package 1. The auxiliary lands 72 are, as illustrated in FIG. 3, arranged on the surface 61a of the base 61 and used for controlling the mount position/orientation of the semiconductor package 1. The auxiliary lands 72 are shaped to be circular in a planar view thereof and aligned with the auxiliary electrodes 52 of the semiconductor package 1, in other words, arranged symmetrically, like the auxiliary electrodes 52. The auxiliary lands 72 are designed to be circular, but may alternatively be of another shape, such as oval or polygon.

The auxiliary lands 72 are larger in planer size than the auxiliary electrodes 52 in order to increase the amount of the solders 8 to improve the reliability of joint with the semiconductor package 1. In order to control flow of the solders 8 melted to mount the semiconductor package 1, the auxiliary lands 72 are arranged to have centers thereof offset from the centers of the auxiliary electrodes 52 in a given direction. This layout and resulting beneficial advantages will be described later in detail.

The auxiliary lands 72 in this embodiment are designed as dummy lands to control the mount position/orientation of the semiconductor package 1 along with the auxiliary electrodes 52 of the semiconductor package 1. The auxiliary lands 72 will also be referred to as position/orientation control lands.

The solders 8 are formed on the lands 71 and 72 using, for example, printing techniques and used to mount the semiconductor package 1.

The position/orientation control lands and the position/orientation control electrodes joined to the position/orientation control lands through the solders 8 will also be referred to as position/orientation control pairs for the sake of convenience in the following discussion. In other words, the semiconductor device S1 is equipped with a plurality of position/orientation control pairs which are arranged symmetrically with respect to the center of the semiconductor package 1 in a planar view thereof.

The semiconductor device S1 in this embodiment is designed to have the above basic structure.

Production Method

An example of a production method of the semiconductor device S1 in this embodiment will be described below with reference to FIGS. 4A to 4C.

Figure 4A:
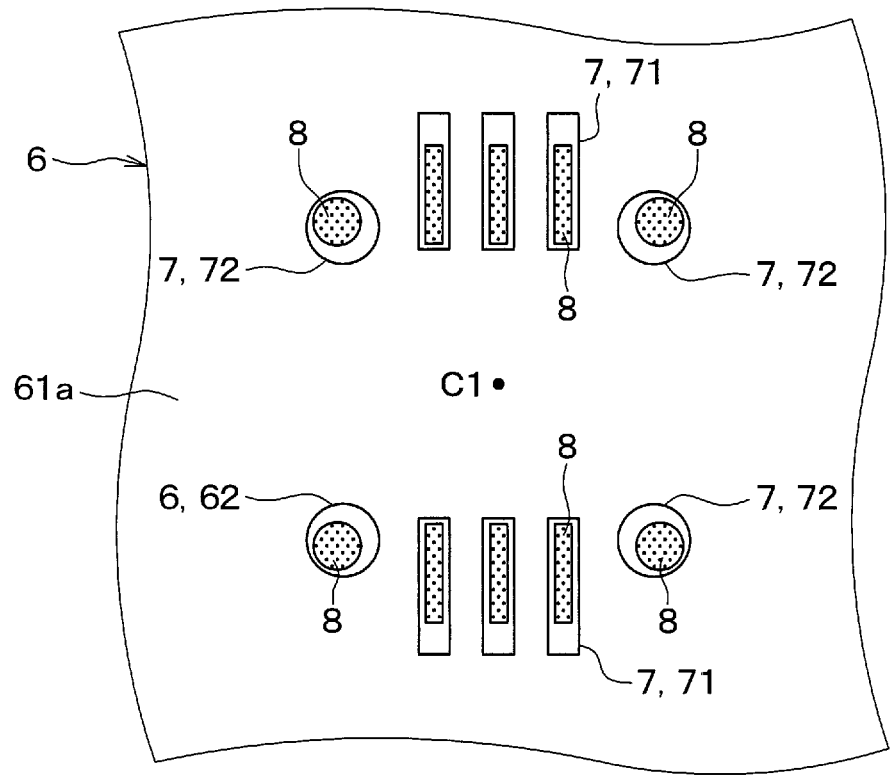
FIG. 4A is a view which shows one of the manufacturing processes of the semiconductor device in FIG. 1 to prepare a substrate.
Figure 4B:
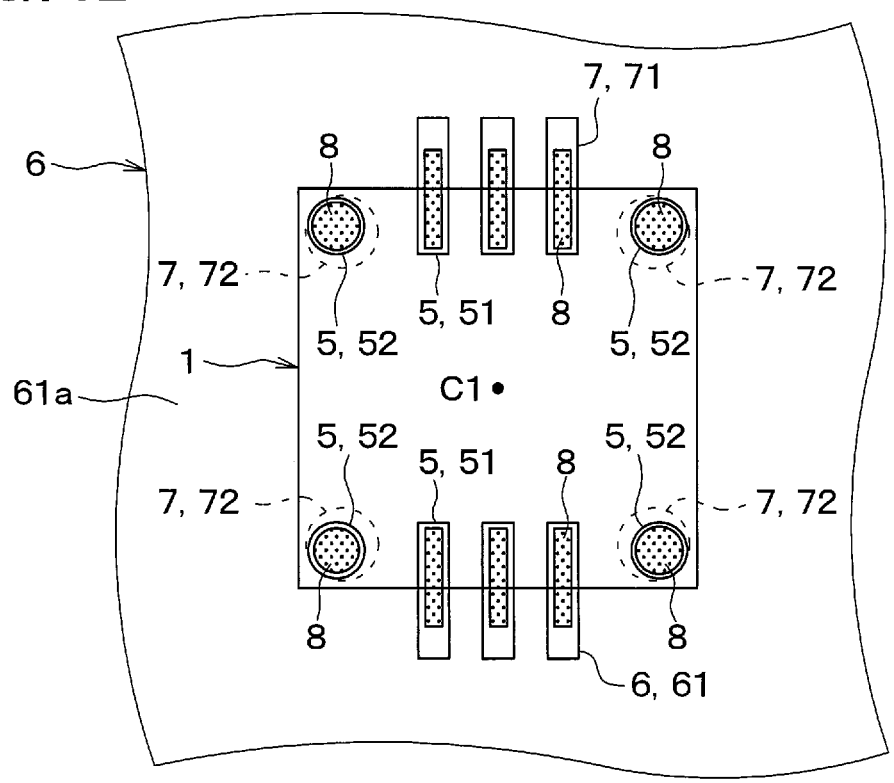
FIG. 4B is a view which shows a process to position a semiconductor package and a substrate following the process in FIG. 4A.
Figure 4C:
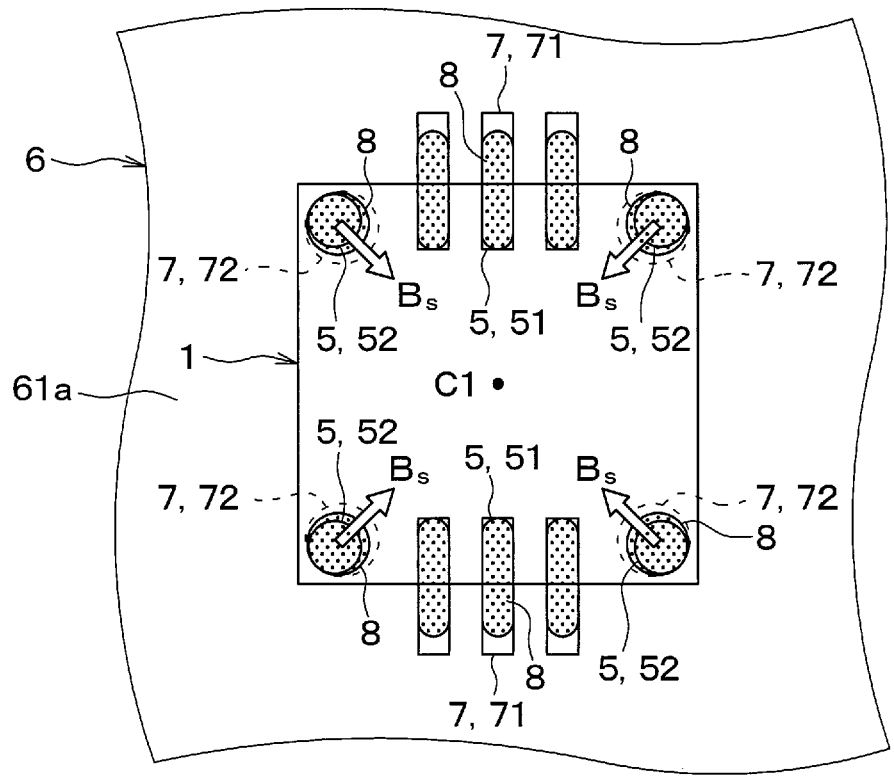
FIG. 4C is a view which demonstrates surface tension vectors arising from solders melted in a process to join a semiconductor device and a substrate together following the process in FIG. 4B.

FIGS. 4A to 4C do not show cross sections of the solders 8, but illustrate them using hatching for facilitating for ease of visibility and better understanding thereof. FIGS. 4B and 4C also omits the outline of the semiconductor package 1 and parts other than the electrodes 51 and 52, the substrate 6, the lands 71 and 72, and the solders 8 for facilitating the visibility.

The semiconductor device S1 may be made using a known semiconductor manufacturing process except for controlling the mount position/orientation during a joining process, as will be described later, using the solders 8. The following discussion will, therefore, mainly refer to processes of production of the semiconductor device S1 associated with the mount position/orientation.

First, the substrate 6 equipped with the signal lands 71 and the auxiliary lands 72 is, as illustrated in FIG. 4A, prepared. The solders 8 are applied to the lands 71 and 72 using printing techniques. The substrate 6, as can be seen in FIG. 4A, gas the four auxiliary lands 72 which are circular in a planar view thereof and arranged symmetrically with each other. Specifically, the four auxiliary lands 72 are, as clearly shown in FIG. 4A, disposed to be point-symmetrical about the center C1 of an arrangement of, in other words, among the auxiliary lands 72. The center C1 is defined to be located at equal intervals away from the four auxiliary lands 72 in a planar view thereof. In other words, the center C1 coincides with the center of the layout of the auxiliary electrodes 52 when the semiconductor package 1 is mounted on the substrate 6.

The solders 8 are, as shown in FIG. 4A, applied to areas on the signal lands 71 which are located around the outer edge of the semiconductor package 1 to be mounted on the substrate 6. The solders 8 are also applied in a subsequent process shown in FIG. 4B to areas of the auxiliary lands 72 which are located at least inside the outline of the auxiliary electrodes 52. Other areas of the auxiliary lands 72 are exposed outside the solders 8. This is to cause the solders 8, which are applied to the auxiliary lands 72 and then melted in a reflow process, to flow toward the center C1 to control the mount position/orientation of the semiconductor package 1.

It is advisable that the solders 8 be applied to areas of the signal lands 71 and the auxiliary lands 72 which are located inside them. This is to prevent the solders 8 from flowing outside the outlines of the lands 71 and 72 and creating solder balls when the semiconductor package 1 is, as demonstrated in FIG. 4B, mounted.

Subsequently, the semiconductor package 1 equipped with the signal electrodes 51 and the auxiliary electrodes 52 produced in a semiconductor manufacturing process is, as demonstrated in FIG. 4B, prepared. The semiconductor package 1 is then positioned and mounted on the substrate 6. Specifically, the semiconductor package 1 is disposed on the substrate 6 to position the centers of the auxiliary electrodes 52, as clearly illustrated in FIG. 4B, to be offset from those of the auxiliary lands 72 in a planar view thereof and also position the auxiliary electrodes 52 coaxially with the solders 8. More specifically, each of the four auxiliary lands 72 is, as can be seen in FIG. 4B, located to have the center thereof offset from that of a corresponding one of the auxiliary electrodes 52 close to the center C1.

Afterwards, thermal energy is added to melt the solders 8, thereby joining the semiconductor package 1 and the substrate 6 together. This causes, as demonstrated in FIG. 4C, the solders 8 which are melted on the auxiliary lands 72 to flow toward the center C1. The surface tensions of the melted solders 8, as indicated by open arrows, create forces Bs attracting the semiconductor package 1 toward the center C1. The attractive forces Bs will also be referred to below as surface tension vectors Bs for the sake of convenience.

As many surface tension vectors Bs as the auxiliary lands 72 serving as the position/orientation control lands are developed and oriented, as indicated by the open arrows in FIG. 4C, toward the center C1. This causes the surface tension vectors Bs to attract four corners of the semiconductor package 1 toward the center C1, so that they are cancelled each other, thereby holding the semiconductor package 1 in a desired position and orientation.

Additionally, the solders 8 applied to the upper surfaces of the signal lands 71 are, like the solders 8 on the auxiliary lands 72, melted, so that they expand, thereby developing self-alignment to bring the outlines of the signal electrodes 51 into coincidence with those of the signal lands 71. In other words, the solders 8 on the auxiliary lands 72 serve to create the self-alignment to hold the semiconductor package 1 from being inclined in an unintended direction. Simultaneously, the solders 8 on the signal lands 71 also serve to create the self-alignment to align positions of the signal lands 71 with those of the signal electrodes 51.

In the following discussion, a linear direction from the center of each of the auxiliary electrodes 52 to a corresponding one of the auxiliary lands 72 which is joined to that auxiliary electrode 52 will also be referred to as an offset direction for the simplicity of explanation.

It is advisable that the auxiliary electrodes 52, as illustrated in FIG. 4C, be arranged inside the outlines of the auxiliary lands 72, and portions of the outlines of the auxiliary electrodes 52 which are located farther away from the center C1 in the offset direction be arranged to coincide with the outlines of the auxiliary lands 72. This is for causing almost all of the solders 8 melted in a solder joining process to expand and flow in the offset direction to enhance the accuracy in controlling the mount position/orientation of the semiconductor package 1.

It is also advisable that a difference in thermal capacity among the auxiliary lands 72 be lower than a given value in order to ensure the self-alignment effects offered by the solders 8 on the auxiliary lands 72, in other words, minimize a risk that a difference between times when the solders 8 on the auxiliary lands 72 are melted, that is, when the surface tension vectors Bs are created may result in less effect in keeping the mount position/orientation of the semiconductor package 1. Selecting the difference in thermal capacity among the auxiliary lands 72 to be lower than the given value may be made by designing the auxiliary lands 72 to have substantially the same areas. Such selection, however, may alternatively made in another way.

Finally, the solders 8 are hardened again to firmly secure the semiconductor package 1 on the substrate 6. In the above processes, the semiconductor device S1 is completed to have the semiconductor package 1 mounted on the surface 61a of the substrate 6 in the required mount position/orientation.

The above discussion has referred to an example where the auxiliary electrodes 52 and the auxiliary lands 72, that is, the position/orientation control pairs are located to be point-symmetrical, but however, they may be arranged symmetrically in another layout as long as the surface tension vectors Bs balance with each other in the solder joining process. For instance, the auxiliary electrodes 52 and the auxiliary lands 72 may be arranged to be line-symmetrical.

Control of Mount Position/Orientation of Semiconductor Package

The control of the mount position/orientation of the semiconductor package 1 achieved by the auxiliary electrodes 52 and the auxiliary lands 72 will be described below with reference to FIGS. 5A, 5B, and 6.

Figure 5A:
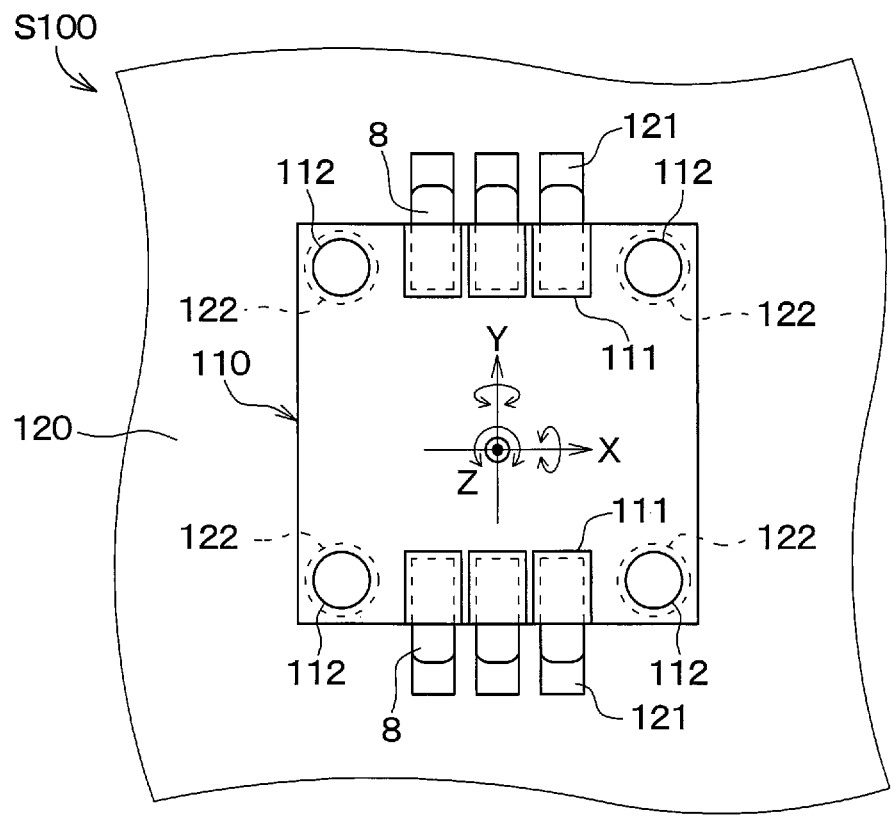
FIG. 5A is a view which illustrates upper surface layout of a conventional semiconductor device.
Figure 5B:
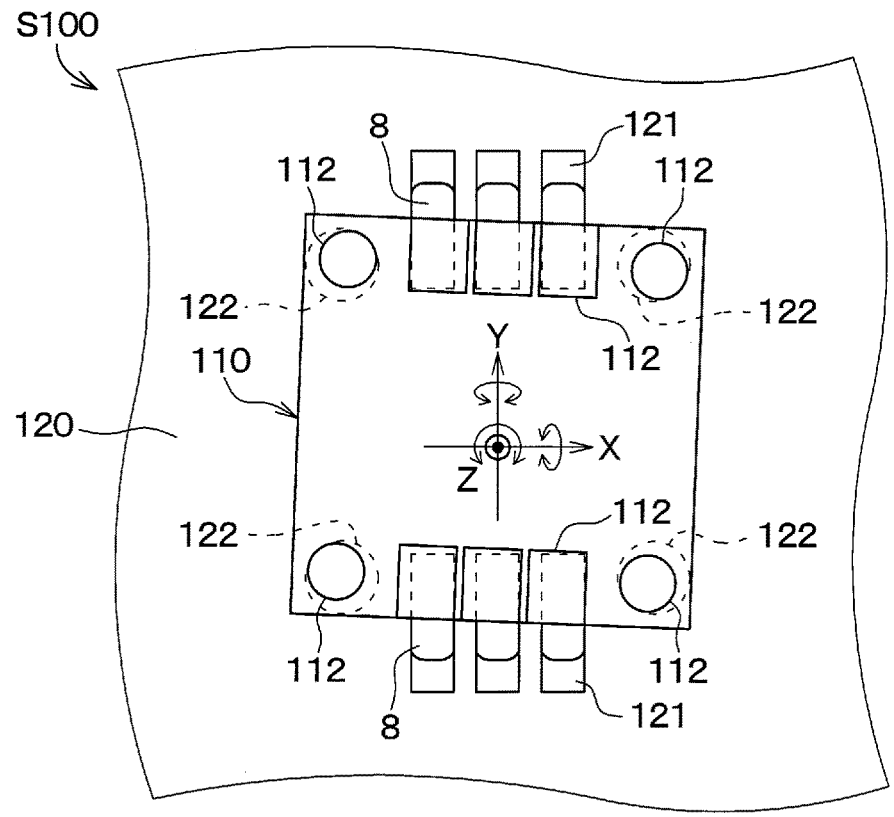
FIG. 5B is a view which illustrates an error in mount position/orientation of a semiconductor package of a conventional semiconductor device in a solder joining process.
Figure 6:
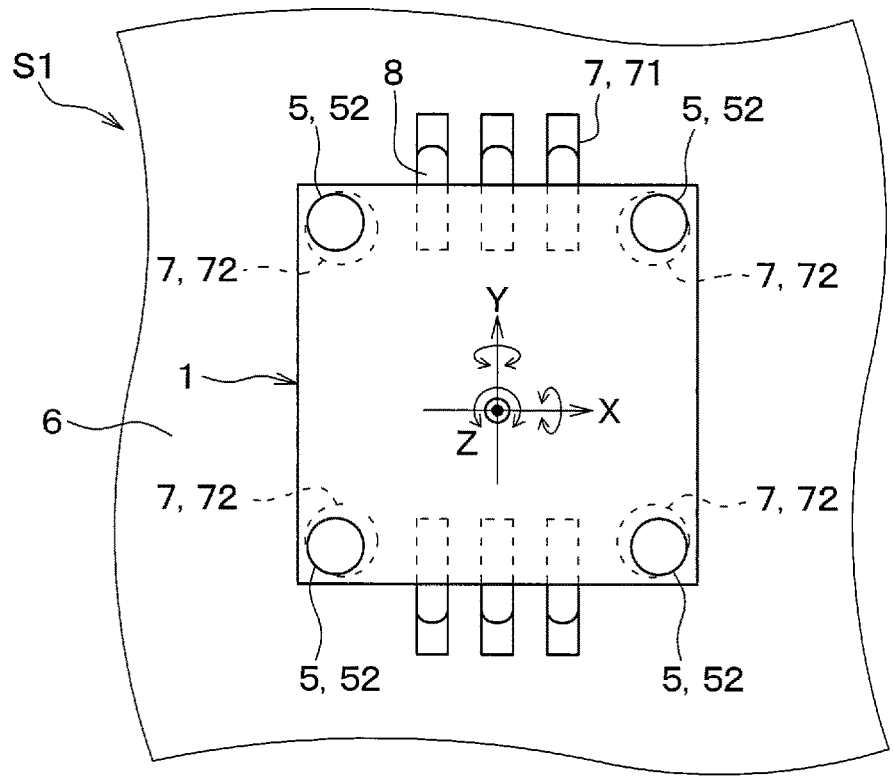
FIG. 6 is a view of a mount position and orientation of a semiconductor package installed in the semiconductor device shown in FIG. 1.

For the sake of simplicity of explanation in FIGS. 5A to 6, a lateral direction in the drawings is defined as an X-direction. A direction perpendicular to the X-direction is defined as a Y-direction. A direction perpendicular to a X-Y plane is defined as a Z-direction. For facilitating the visibility in FIGS. 5A to 6, portions or all of the lands 7 invisible behind the semiconductor package 1 or 110 in a planar view thereof are indicated by broken lines. Portions or all of the electrodes 5, 111, and 112 invisible behind the semiconductor package 1 or 110 in a planar view thereof are indicated by solid lines.

First, a comparative example of a prior art semiconductor device S100 will be described below with reference to FIGS. 5A and 5B.

The semiconductor device S100, as clearly illustrated in FIG. 5A, has the semiconductor package 110 which is equipped with the signal electrodes 111 and the auxiliary electrodes 112 and mounted on the substrate 120 through the solders 8. The substrate 120 has the signal lands 121 and the auxiliary lands 122 arranged thereon. The semiconductor device S100 is designed to have the signal lands 121 larger in planar size thereof than the signal electrodes 111 and also have the auxiliary lands 122 larger in planar size than the auxiliary electrodes 112. In other words, the semiconductor device S100 has the electrodes 111 and 112 to which the signal lands 121 and the auxiliary lands 122 are joined through the solders 8 and which are shaped to expand in all directions. This results in an increase in volume of the solders 8, thereby ensuring the joint reliability using the solders 8.

The solders 8 applied to the lands 121 and 122 on the substrate 120 cover portions of the lands 121 and 122 which are located inside outlines of the lands 121 and 122. Other portions of the lands 121 and 122 are exposed outside the solders 8. This is to minimize a risk that when the semiconductor package 1 is mounted on the substrate 120, the solders 8 may be melted so that they spread out of the lands 121 and 122 to form solder balls or solder bridges.

The above structure, however, faces a drawback that the solders 8 which have been melted to join the semiconductor package 110 to the substrate 120 may spread on the lands 121 and 122 in all directions, thereby leading to a risk that the semiconductor package 110 may move until the solders 8 are hardened again, and exertion of force on the moving semiconductor package 110 may, as demonstrated in FIG. 5B, cause the semiconductor package 110 to be shifted in an unintended direction on the X-Y plane or in the Z-direction and then mounted on the substrate 120.

In contrast to the above, the semiconductor device S1 in this embodiment is engineered to produce the semiconductor package 1 whose mount position/orientation is controlled using the surface tension vectors. The semiconductor device S1 is, therefore, made to have the semiconductor package 1 and the substrate 6 which are, as illustrated in FIG. 6, arranged without any positional and angular misalignment or misorientation in the X-direction, the Y-direction, and the Z-direction.

The auxiliary lands 72 are shaped to have areas larger than those of the auxiliary electrodes 52, thereby enabling the volume of the solders 8 on the auxiliary lands 72 to be increased to enhance the reliability of joint between the auxiliary electrodes 52 and the auxiliary lands 72 using the solders 8.

In this embodiment, the auxiliary electrodes 52 and the auxiliary lands 72 are offset from each other so as to have the solders 8 which are melted and then expand in the solder joining process to create the surface tension vectors Bs which attract the semiconductor package 1 in a desired direction. The auxiliary electrodes 52 and the auxiliary lands 72 are symmetrically arranged to achieve a balance between the surface tension vectors Bs developed in the solder joining process. The area of each of the auxiliary lands 72 is selected to be larger than that of each of the auxiliary electrodes 52 to increase the quantity of the solders 8 to be larger than a given value.

In the above away, the semiconductor device S1 is made to have the semiconductor package 1 arranged in the controlled mount position/orientation and also have the solders 8 whose volume is large enough to ensure the reliability of the solder joint of the semiconductor package 1. To say it a different way, the semiconductor device S1 is configured to achieve improved reliability of both the mount position/orientation and the solder joint of the semiconductor package 1.

Accordingly, in a case where the semiconductor device S1 whose the mount position/orientation is controlled is installed in, for example, a vehicle, it is easy to bring a direction in which the sensor 21 is oriented to measure a given physical quantity into agreement with a traveling direction of the vehicle, thereby enhancing the measurement accuracy of the sensor 21 and meeting requirements for the sensor 21 in use.

The controlled mount position/orientation of the semiconductor package 1 also minimizes a risk that the solders 8 melted in the solder joining process may flow outside the outlines of the lands 7 to form solder balls or a solder bridge.

Second Embodiment

The semiconductor device S2 in the second embodiment will be described below with reference to FIGS. 7 and 8.

Figure 7:
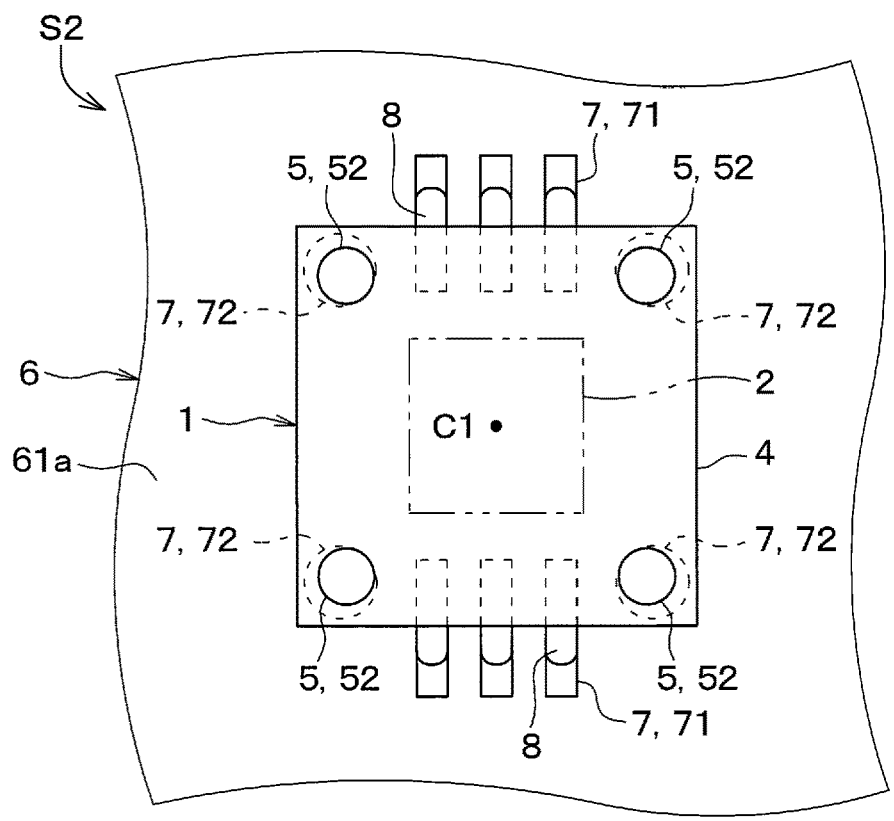
FIG. 7 is a view which shows upper surface layout of a semiconductor device according to the second embodiment.

In FIG. 7, the outline of the semiconductor chip 2 which is invisible from above the upper surface of the semiconductor package 1 is, like in FIG. 1, denoted by a chain double-dashed line. Outlines of portions of the signal lands 71 which are visually covered with the semiconductor package 1 are denoted by broken lines. Similarly, outlines of the auxiliary lands 72 are indicated by broken lines. The auxiliary electrodes 52 are indicated by solid lines. For the same purpose as the above, portions of the solders 8 which are visually covered with the semiconductor package 1 so that they are invisible from above the upper surface of the semiconductor package 1 are omitted from FIG. 1. FIG. 8 does not show cross sections of the solders 8, but illustrates them using hatching for facilitating for ease of visibility and better understanding thereof. FIG. 8 also omits the outline of the semiconductor package 1 and parts other than the electrodes 51 and 52, the substrate 6, the lands 71 and 72, and the solders 8 for facilitating the visibility.

The semiconductor device S2 in this embodiment is, as shown in FIG. 7, different from in the first embodiment in that the auxiliary lands 72 are arranged to have centers thereof which are located farther away from the center C1 among the auxiliary electrodes 52 than from the centers of the auxiliary electrodes 52 in a planar view thereof. The following discussion will refer mainly to the above feature in this embodiment.

Figure 8:
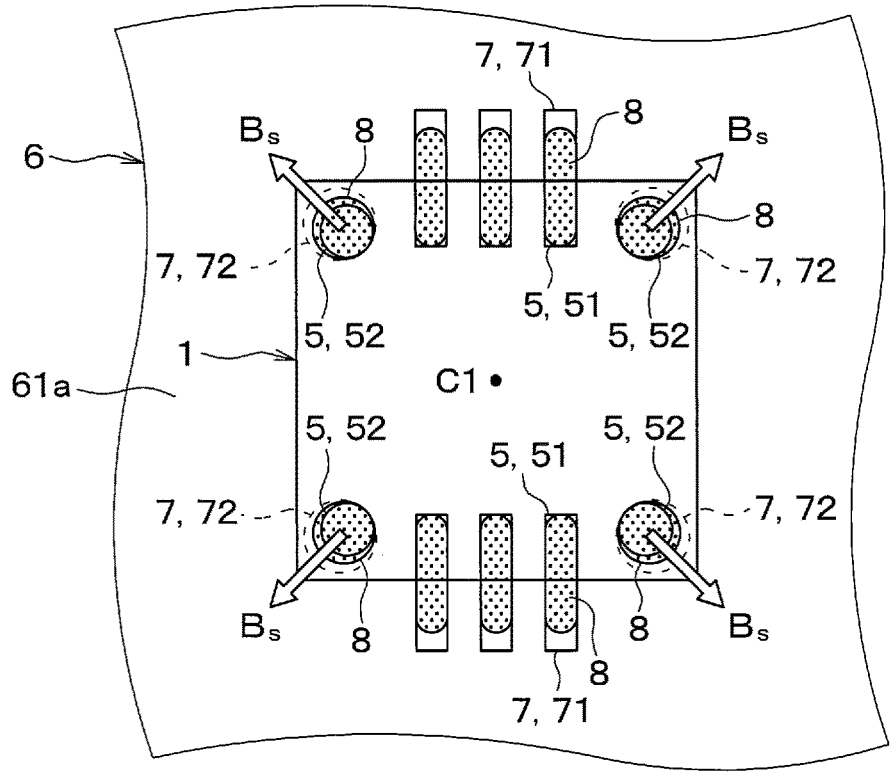
FIG. 8 is a view which demonstrates surface tension vectors produced by solders melted in a solder joining process that is one of the manufacturing processes of the semiconductor device shown in FIG. 7.

The semiconductor device S2 in this embodiment is made in the same manufacturing method as in the first embodiment, but however, a plurality of surface tension vectors Bs created in the solder joining process are, as illustrated in FIG. 8, oriented outwardly in the semiconductor package 1.

Specifically, each of the auxiliary lands 72 occupies one of the auxiliary electrodes 52 inside it in a planar view thereof and is elongated in a radial direction from the center C1. In a solder applying process, the solders 8 are applied to areas of the auxiliary lands 72 which are located at least inside the outlines of the auxiliary electrodes 52. Subsequently, the semiconductor package 1 is mounted. In the solder joining process, the melted solders 8 flow and expand in the radial direction about the center C1 in the planar view thereof, thereby creating a plurality of surface tension vectors Bs which occur at four corners of the semiconductor package 1 and attract the semiconductor package 1 in the radial direction. The surface tension vectors Bs in this embodiment are oriented in a direction opposite that in the first embodiment, but totally balanced with each other, so that they serve to hold the semiconductor package 1 from deviating in an unintended direction. This achieves the mounting of the semiconductor package 1 on the substrate 6 in a controlled mount position/orientation.

In this embodiment, the semiconductor device S2 has the position/orientation control pairs which are, like in the first embodiment, arranged to be symmetrical and thus offers substantially the same beneficial advantages as those in the first embodiment.

Third Embodiment

The semiconductor device S3 in the third embodiment will be described below with reference to FIGS. 9 to 11B.

Figure 9:
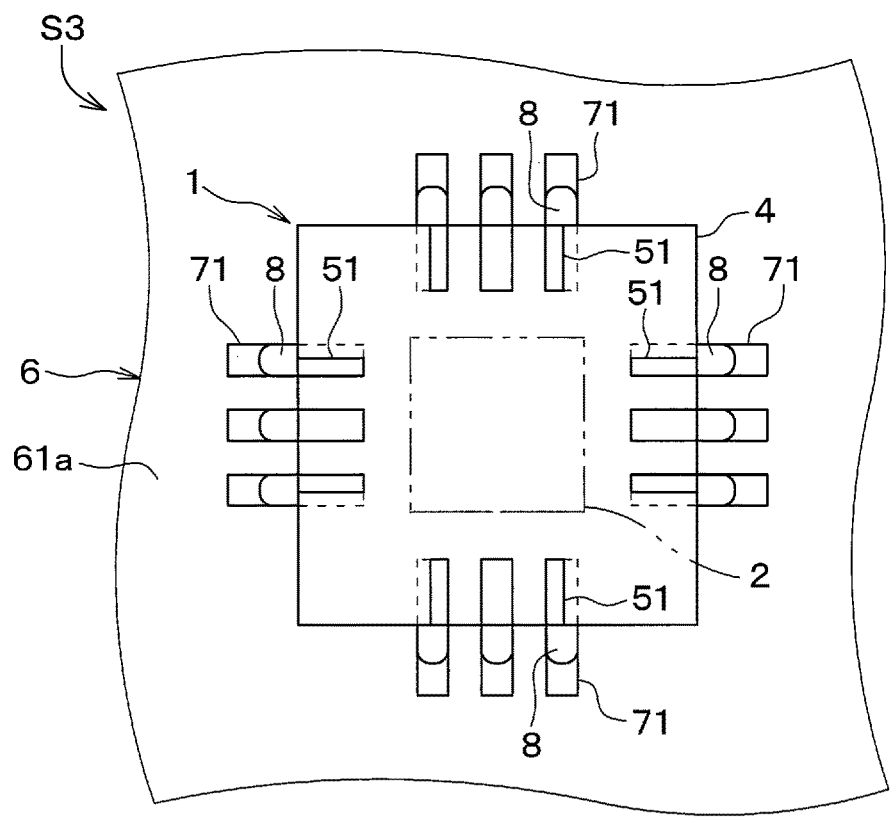
FIG. 9 is a view which shows upper surface layout of a semiconductor device according to the third embodiment.
Figure 10:
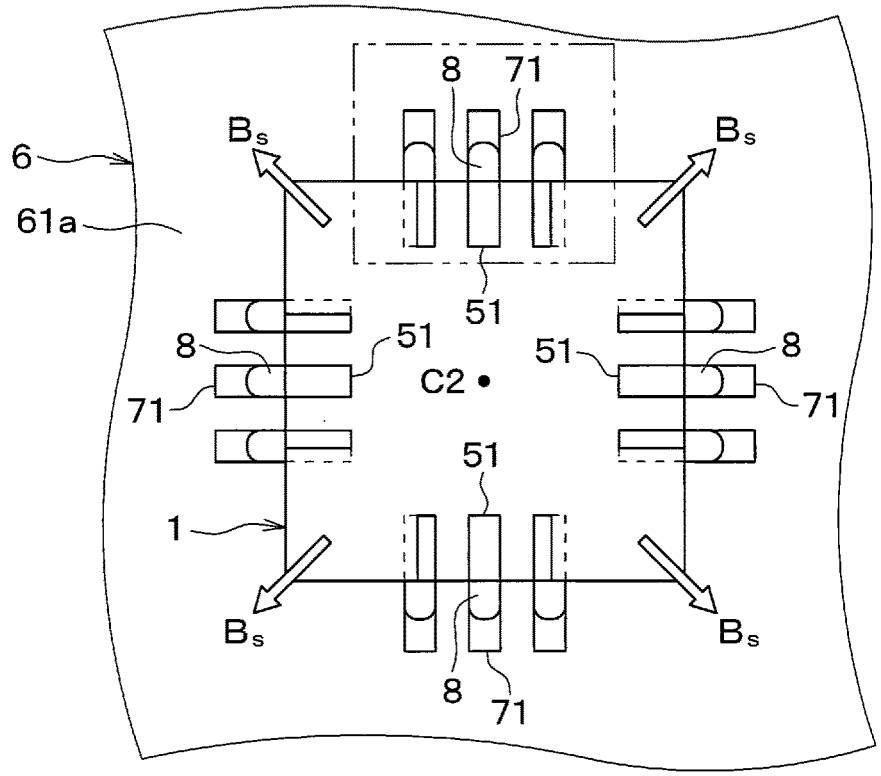
FIG. 10 is a view which demonstrates surface tension vectors produced by solders melted in a solder joining process that is one of manufacturing processes of the semiconductor device shown in FIG. 9.
Figure 11A:
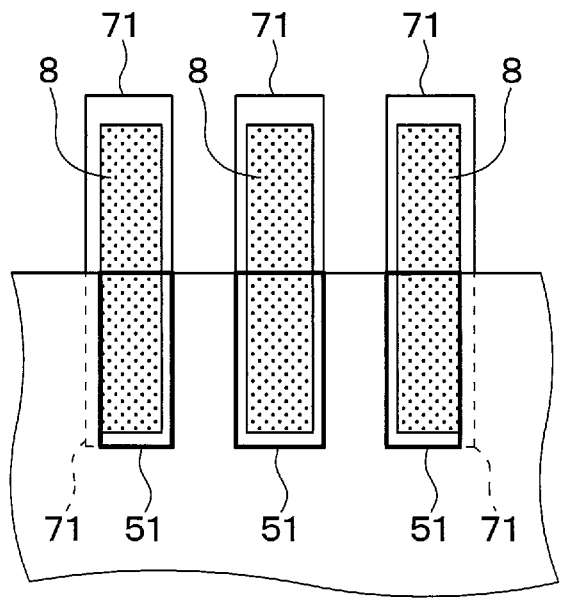
FIG. 11A is a view which illustrates a positional relation among solders, signal electrodes, and signal lands in a region indicated by a chain double-dashed line in FIG. 10 just before a solder joining process.
Figure 11B:
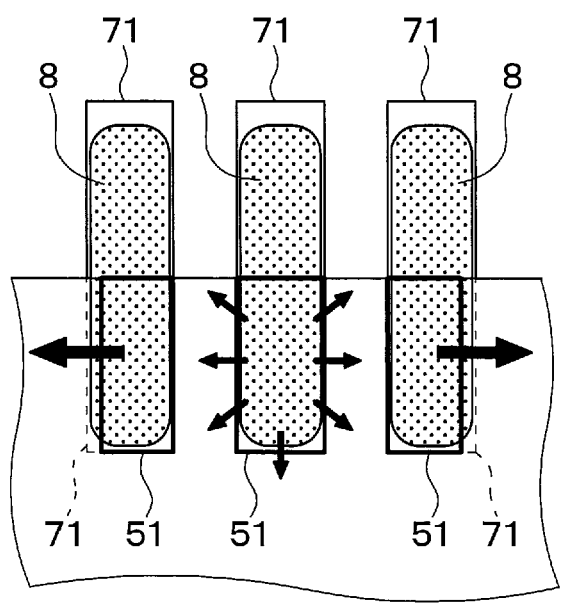
FIG. 11B is a view which demonstrates expansion of solders melted in a solder joining process following a mount process of a semiconductor package illustrated in FIG. 11A.

For the sake of ease of visibility in FIGS. 8 and 10, outlines of portions of the signal lands 71 which are visually covered with the semiconductor package 1 are denoted by broken lines. Outlines of portions of the signal electrodes 51 which are visually covered with the semiconductor package 1 are indicated by solid lines. In FIG. 9, an outline of the semiconductor chip 2 is indicated by a chain double-dashed line. FIGS. 11A and 11B do not show cross sections of the solders 8, but illustrate them using hatching for facilitating for ease of visibility. In FIGS. 11A and 11B, the signal electrodes 51 are indicated by thick solid lines. Portions of the signal lands 71 which are visually behind the semiconductor package 1 are indicated by broken lines. Additionally, directions in which the melted solders 8 flow and extend within the outline of the semiconductor package 1 are indicated by arrows.

The semiconductor device S3 in this embodiment is, unlike in the first embodiment, as illustrated in FIG. 9, configured not to have the auxiliary electrodes 52 and the auxiliary lands 72, but to have the signal electrodes 51 and the signal lands 71 designed as position/orientation control electrodes and position/orientation control lands, respectively. The following discussion will mainly refer to the above feature.

The signal electrodes 51 in this embodiment are, as illustrated in FIG. 9, shaped to extend in a direction intersecting with the outline of the semiconductor package 1 and arranged three on each of four sides defining the outline of the semiconductor package 1. In other words, the semiconductor package 1 in this embodiment is engineered to have a QFN structure. The signal electrodes 51 are connected to the signal lands 71 through the solders 8 and arranged to be symmetrical with each other in a planar view thereof along with the signal lands 71 to which the signal electrodes 51 are connected through the solders 8.

Specifically, every three of the signal electrodes 51 which cross one of the outer sides of the semiconductor package 1 are, as illustrated in FIG. 11A, arranged to be symmetrical with respect to a middle one of the three signal electrodes 51.

The above layout of the signal electrodes 51 is true for on the four outer sides of the semiconductor package 1. In other words, the semiconductor device S3 in this embodiment has the signal electrodes 51 and the signal lands 71 connected to the signal electrodes 51 through the solders 8 as the position/orientation control pairs. The position/orientation control pairs are arranged to be symmetrical with respect to the center of the semiconductor package 1.

The following discussion will refer to the three signal electrodes 51 illustrated in FIGS. 11A and 11B as a representable example. For the sake of simplicity of explanation, a left one of the signal electrodes 51 will be referred to as a left signal electrode 51. A middle one of the signal electrodes 51 will be referred to as a middle signal electrode 51. A right one of the signal electrodes 51 will be referred to as a right signal electrode 51.

Each of the right signal electrode 51 and the left signal electrode 51 is, as can be seen in FIG. 11A, shaped to have a width, i.e., a dimension which extends in a direction (which will also be referred to as an outline-parallel direction) parallel to one of the sides of the outline of the semiconductor package 1 with which the right signal electrode 51 and the left signal electrode 51 intersect and is smaller than those of the middle signal electrode 51 and the signal lands 71. The right signal electrode 51 and the left signal electrode 51 are identical in area with each other. Each of the right signal electrode 51 and the left signal electrode 51 is located, as can be seen in FIG. 11A, in coincidence with a first one of the sides of the outline of a corresponding one of the signal lands 71 the above electrode 51 directly faces. The first side of the outline of each of the signal lands 71 is close to the middle signal electrode 51. The middle signal electrode 51 is, as clearly illustrated in FIG. 11A, shaped to have a width which extends in the outline-parallel direction and is identical with that of one of the signal lands 71 the middle signal electrode 51 directly faces. The middle signal electrode 51 is arranged to have an outline thereof which coincides with that of a corresponding one of the signal lands 71.

This embodiment, as shown in FIG. 9, has as many signal lands 71 as the signal electrodes 51. Each of the signal lands 71 is aligned with a respective one of the signal electrodes 51. The signal lands 71 are designed to have at least portions which are located inside the outline of the semiconductor package 1 and identical in area with each other. The signal lands 71 are, as can be seen in FIG. 11B, shaped to cause the solders 8 to flow and expand in given directions in the solder joining process.

Specifically, in the solder joining process, the melted solder 8 just beneath the middle signal electrode 51, as can be seen in FIG. 11B, flows and expands in all directions. The melted solder 8 just beneath the right signal electrode 51 mainly flows and expands in the right direction, as viewed in the drawing. The solder 8 just beneath the left signal electrode 51 mainly flow and expands in the left direction, as viewed in the drawing. These flows of the solders 8 are true for the four sides of the outer line of the semiconductor package 1. This causes the melted solders 8, as illustrated in FIG. 10, to create the surface tension vectors Bs on the four corners of the semiconductor package 1 in the solder joining process to attract the semiconductor package 1 in the radial direction about the center C2 of the semiconductor package 1. The surface tension vectors Bs are totally cancelled each other to place the semiconductor package 1 on the substrate 6 in the controlled mount position/orientation.

This embodiment realizes the semiconductor device S3 which offers substantially the same beneficial advantages as those in the first embodiment.

Fourth Embodiment

The semiconductor device S4 in the fourth embodiment will be described below with reference to FIGS. 12 and 13.

Figure 12:
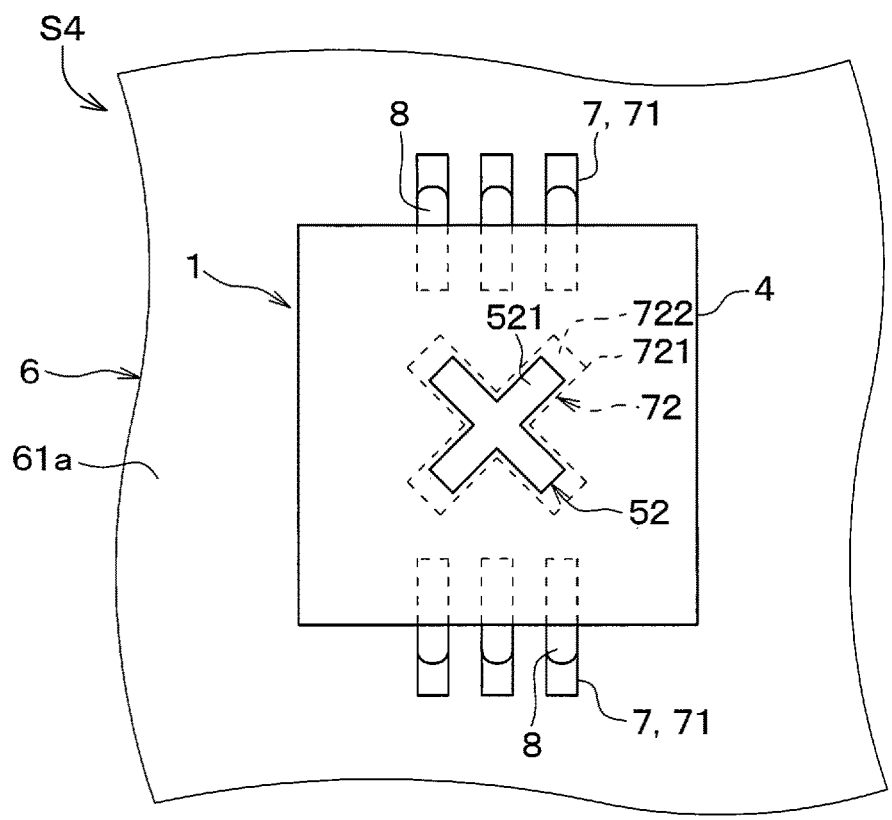
FIG. 12 is a view which shows upper surface layout of a semiconductor device according to the fourth embodiment.
Figure 13:
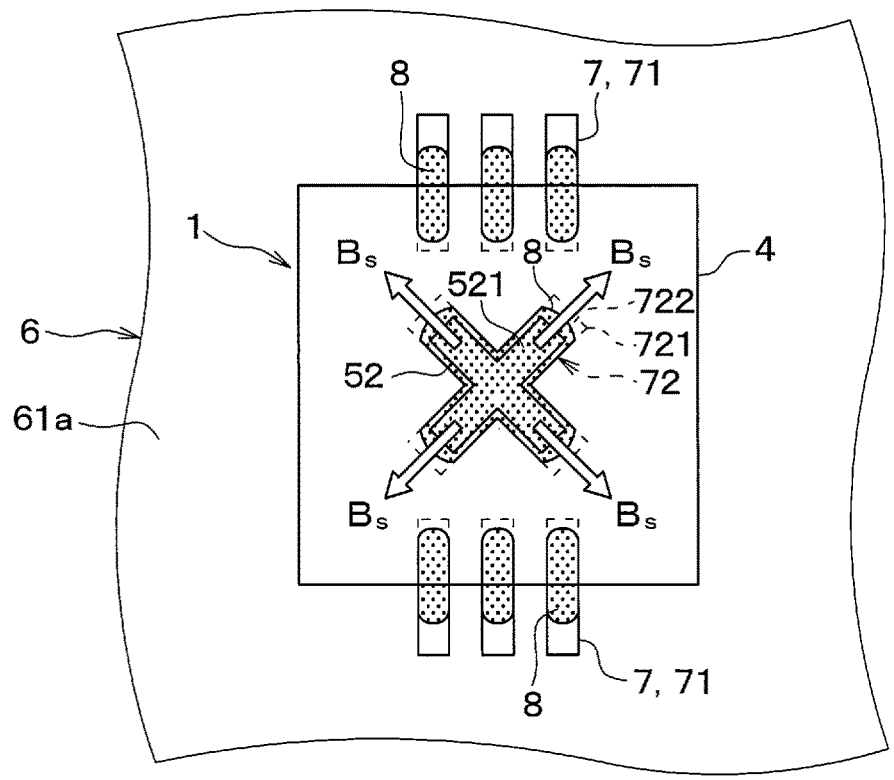
FIG. 13 is a view which demonstrates surface tension vectors produced by solders melted in a solder joining process that is one of manufacturing processes of the semiconductor device shown in FIG. 12.

For the sake of ease of visibility in FIGS. 12 and 13, outlines of portions of the auxiliary lands 72 which are visually covered with the semiconductor package 1 so that they are invisible in a planar view thereof are denoted by broken lines. Outlines of portions of the auxiliary electrodes 52 which are visually covered with the semiconductor package 1 so that they are invisible in a planar view thereof are indicated by solid lines. The semiconductor chip 2 is omitted. FIG. 13 does not show cross sections of the solders 8, but illustrates them using hatching for facilitating for ease of visibility. In FIG. 13, directions in which the surface tension vectors Bs, as developed in the solder joining process made using the solders 8, are oriented are indicated by open arrows.

The semiconductor device S4 in this embodiment is, as clearly illustrated in FIG. 12, designed to have a single auxiliary electrode 52 and a single auxiliary land 72 and different from the first embodiment in that the auxiliary electrode 52 is used as a position/orientation control electrode, and the auxiliary land 72 is used as a position/orientation control land. This embodiment will mainly refer to the above feature.

There is, as can be seen in FIG. 12, the one auxiliary land 72 in this embodiment which serves as a position/orientation control land. The auxiliary land 72 includes a plurality of extensions 721 which are oriented in a radial direction about the center of the semiconductor package 1 in a planar view where the semiconductor package 1 is mounted on the substrate 6.

Specifically, the auxiliary land 72 in this embodiment includes the four extensions 721, however, the number of the extensions 721 may be changed as needed. In the following discussion, the extensions 721 will also be referred to as the first extensions 721. In order to facilitate adjustment of the surface tension vectors Bs, as will be described later, it is advisable that the first extensions 721 be shaped to have planar sizes and planar shapes identical or near identical with each other.

There is, as illustrated in FIG. 12, the single auxiliary electrode 52. The auxiliary electrode 52 functions as a position/orientation control electrode and forms a position/orientation control pair along with the auxiliary land 72. The auxiliary electrode 52 is arranged inside the outline of the auxiliary land 72 in a planar view of FIG. 12 and includes a plurality of second extensions 521 each extending along a respective one of the first extensions 721. In other words, in a case where the auxiliary lands 72 is equipped with the four first extensions 721, the auxiliary electrodes 52 includes the four second extensions 521.

For the same reasons as the first extensions 721, it is advisable that the second extensions 521 be shaped to have planar sizes and planar shapes identical or near identical with each other. The number of second extensions 521 may be changed as needed as long as it is identical with that of first extensions 721.

Next, a positional relation between the first extensions 721 and the second extensions 521 and beneficial advantages offered thereby will be described below with reference to FIG. 13.

The first extensions 721, as clearly illustrated in a planar view of FIG. 12, extend outside the second extensions 521 in a lengthwise direction thereof. In other words, each of the first extensions 721 has an outer portion 722 arranged outside the outline of a corresponding one of the second extensions 521. The outer portions 722 are arranged to be line- or point-symmetrical with respect to the center of the semiconductor package 1 in order to control the surface tension vectors Bs to secure a required mount position/orientation of the semiconductor package 1.

Specifically, the outer portions 722 define regions, as can be seen in FIG. 13, in which the solders 8 melted to join to the semiconductor package 1 expand. The outer portions 722 are, as described above, arranged symmetrically with each other, thereby causing, as illustrated in FIG. 13, the surface tension vectors Bs, as occurring on the outer portions 722, to cancel each other. The semiconductor device S4 is, therefore, capable of increasing the volume of the solders 8, but holding, like in the first embodiment, the semiconductor package 1 from being moved in an unintended direction in the solder joining process.

The position/orientation control pair in this embodiment is disposed around the center of a mounted surface of the semiconductor package 1 and serves to release thermal energy produced by the semiconductor package 1 after the semiconductor package 1 is mounted on the substrate 6. In a case where the first extensions 721 and the second extensions 521 are shaped to have planar sizes and planar shapes identical or near identical with each other, it is advisable that the outer portions 722 be shaped to have planar sizes identical or near identical with each other. The position/orientation control lands and the position/orientation control electrodes in each of the first to third embodiments are offset from each other in a planar view thereof, but however, may alternatively be arranged to have centers aligned with each other.

Other Embodiments

This disclosure has referred to the embodiments, but is not limited to the embodiments or structures referred to above. This disclosure may include modified forms of the embodiments or equivalents thereof. The disclosure should be understood to include all possible embodiments and modifications to the shown embodiments which can be embodied without departing from the principle of the disclosure.

1) The first embodiment has referred to the example where the semiconductor package 1 has the semiconductor chip 2 disposed in the housing 4, but is not limited to the structure illustrated in FIGS. 2 and 3. For example, the semiconductor package 1 only have to function as a physical quantity sensor. The semiconductor chip 2 may be designed to have a structure covered with a molded resin expect for the sensor 21 or another optional structure.

2) Each of the above embodiments has referred to the example wherein the position/orientation control electrodes of the electrodes 5 and the position/orientation control lands of the lands 7 are arranged symmetrically with each other, but such symmetrical layout does not only mean that the outlines of the position/orientation control electrodes or the outlines of the position/orientation control lands match or coincide with each other when they are rotated about a point or turned about a line. The symmetrical layout, as referred to in this disclosure, at least includes an arrangement in which outlines of portions of, for example, the position/orientation control lands on which the melted solders 8 wet and expand match each other when rotated or turned about a center line among those outlines.

3) The first and second embodiments refer to the example where each of the position/orientation control lands is arranged to have the center thereof offset from that of a facing one of the position/orientation control electrodes close to or father away from the outline of the semiconductor package 1, but the position/orientation control electrodes and position/orientation control lands may be arranged in another positional relation to each other as long as the surface tension vectors Bs, as arising from melting of the solders 8, cancel each other. The layout or the number of the position/orientation control electrodes or the position/orientation control lands is not limited to the ones described above.

In the case where the semiconductor package 1 is in a quadrangular plate shape and equipped with a total number of four position/orientation control electrodes and a total number of four position/orientation control lands, and the position/orientation control electrodes are one on each of four corners of the semiconductor package 1, two of the position/orientation control lands which are diametrically or diagonally opposed to each other may be arranged to have the centers thereof which are located closer to the center of the semiconductor package 1 than those of the position/orientation control electrodes are, and the centers of the other position/orientation control lands may be located farther away from the center of the semiconductor package 1 than those of the other position/orientation control electrodes are. This layout also serves to cause the surface tension vectors Bs to cancel each other, thereby holding the semiconductor package 1 from being deviated in an unintended direction. The number or layout of the position/orientation control electrodes and the position/orientation control lands may be, as described above, altered as needed.

4) The position/orientation control electrodes and the position/orientation control lands only have to be identical in number with each other and arranged symmetrically with each other. The number of position/orientation control electrodes or position/orientation control lands is not limited to the one described above.

5) Each of the above embodiments refers to the substrate 6 used as a mount member. The mount member does not necessarily to be a circuit substrate, but may be implemented by an object which is equipped with the lands 7 and on which the semiconductor package 1 is mountable.

What is claimed is:

1. A semiconductor device comprising:
    a semiconductor package which is equipped with a plurality of electrodes; and
    a mount member which is equipped with a plurality of lands and on which the semiconductor package is mounted, wherein:
    the semiconductor package has the electrodes joined to the lands through solders,
    at least a subset of the electrodes work as position/orientation control electrodes to control a position and orientation of the semiconductor package relative to a mount surface that is a surface of the mount member which faces the semiconductor package,
    at least a subset of the lands work as position/orientation control lands to control the position and orientation of the semiconductor package relative to the mount surface of the mount member,
    each of the position/orientation control electrodes is arranged in a planar view thereof to have a center thereof offset from a center of a respective one of the position/orientation control lands which is joined to the position/orientation control electrode through the solder, each of the position/orientation control electrodes lying inside an outline of a corresponding one of the position/orientation control lands
    the number of position/orientation control lands and the number of position/orientation control electrodes are plural,
    each of the position/orientation control electrodes is exposed outside only a lower surface of the semiconductor package which faces the mount member,
    each of the position/orientation control lands is arranged in a planar view thereof in a region located inside an outline of the semiconductor package,
    a direction from the center of each of the position/orientation control electrodes to the center of a corresponding one of the position/orientation control lands is defined as an offset direction toward a center of the semiconductor package in a planar view thereof, a spread of each of the position/orientation control lands relative to a corresponding one of the position/orientation control electrodes becomes larger in the offset direction than in a direction opposite the offset direction, each of the position/orientation control lands and a respective one of the position/orientation control electrodes which are joined together through one of the solders are defined as a position/orientation control pair, the position/orientation control pairs being arranged to be symmetrical with respect to the center of the semiconductor package in the planar view thereof, each solder of the solders between all of the position/orientation control electrodes and all of the position/orientation lands is arranged in the planar view thereof only inside an outline of the semiconductor package, and the position/orientation control electrodes are arranged to have portions of outlines thereof which are at least located far away in the direction opposite the offset direction and coincide with outlines of the position/orientation control lands joined to the position/orientation control electrodes through the solders in a planar view thereof.

2. The semiconductor device as set forth in claim 1, wherein the position/orientation control pairs are arranged to be point-symmetrical or line-symmetrical with each other.

3. The semiconductor device as set forth in claim 1, wherein the position/orientation control electrodes are designed as auxiliary electrodes which are different from signal electrodes, as included in the electrodes, to which signals outputted from the semiconductor package are transmitted, and of the lands, the position/orientation control lands are designed as auxiliary lands which are different from signal lands to which the signals are transmitted.

4. The semiconductor device as set forth in claim 1, wherein each of the position/orientation control lands is arranged such that their respective centers are located closer to the center of the semiconductor package than the respective centers of their corresponding position/orientation control electrodes in the planar view thereof.

5. The semiconductor device as set forth in claim 1, wherein the semiconductor package is equipped with a sensor working to output a signal as a function of a physical quantity when exerted thereon.

6. The semiconductor device as set forth in claim 1, wherein:

at least one of the position/orientation electrodes is a dummy electrode; and each of the position/orientation electrodes is embedded in the lower surface of the semiconductor package which faces the mount member.

7. The semiconductor device as set forth in claim 1, wherein:

each of the position/orientation lands has an outer peripheral portion which faces away from the center of the semiconductor package, each of the electrodes has an outer peripheral portion which faces away from the center of the semiconductor package, and the outer peripheral portion of each of the position/orientation lands is aligned substantially with the outer peripheral portion of a corresponding one of the position/orientation control electrodes in a thickness direction of the semiconductor package.

8. A semiconductor device comprising:

a semiconductor package which is equipped with a plurality of electrodes; and a mount member which is equipped with a plurality of lands and on which the semiconductor package is mounted, wherein:

the semiconductor package has the electrodes joined to the lands through solders, at least a subset of the electrodes work as position/orientation control electrodes to control a position and orientation of the semiconductor package relative to a mount surface that is a surface of the mount member which faces the semiconductor package, at least a subset of the lands work as position/orientation control lands to control the position and orientation of the semiconductor package relative to the mount surface of the mount member, each of the position/orientation control electrodes is arranged in a planar view thereof to have a center thereof offset from a center of a respective one of the position/orientation control lands which is joined to the position/orientation control electrode through the solder, each of the position/orientation control electrodes lying inside an outline of a corresponding one of the position/orientation control lands the number of position/orientation control lands and the number of position/orientation control electrodes are plural, each of the position/orientation control electrodes is exposed outside only a lower surface of the semiconductor package which faces the mount member, each of the position/orientation control lands is arranged in a planar view thereof in a region located inside an outline of the semiconductor package, a direction from the center of each of the position/orientation control electrodes to the center of a corresponding one of the position/orientation control lands is defined as an offset direction toward a center of the semiconductor package in a planar view thereof, a spread of each of the position/orientation control lands relative to a corresponding one of the position/orientation control electrodes becomes larger in the offset direction than in a direction opposite the offset direction, each of the position/orientation control lands and a respective one of the position/orientation control electrodes which are joined together through one of the solders are defined as a position/orientation control pair, the position/orientation control pairs being arranged to be symmetrical with respect to the center of the semiconductor package in the planar view thereof, each solder of the solders between all of the position/orientation control electrodes and all of the position/orientation lands is arranged in the planar view thereof only inside an outline of the semiconductor package, the position/orientation control electrodes are designed as auxiliary electrodes which are different from signal electrodes, as included in the electrodes, to which signals outputted from the semiconductor package are transmitted, and of the lands, the position/orientation control lands are designed as auxiliary lands which are different from signal lands to which the signals are transmitted.

9. The semiconductor device as set forth in claim 8, wherein the position/orientation control pairs are arranged to be point-symmetrical or line-symmetrical with each other.

10. The semiconductor device as set forth in claim 8, wherein the position/orientation control electrodes are arranged to have portions of outlines thereof which are at least located far away in the direction opposite the offset direction and coincide with outlines of the position/orientation control lands joined to the position/orientation control electrodes through the solders in a planar view thereof.

11. The semiconductor device as set forth in claim 8, wherein each of the position/orientation control lands is arranged such that their respective centers are located closer to the center of the semiconductor package than the respective centers of their corresponding position/orientation control electrodes in the planar view thereof.

12. The semiconductor device as set forth in claim 8, wherein the semiconductor package is equipped with a sensor working to output a signal as a function of a physical quantity when exerted thereon.

13. The semiconductor device as set forth in claim 8, wherein:
  at least one of the position/orientation electrodes is a dummy electrode; and
  each of the position/orientation electrodes is embedded in the lower surface of the semiconductor package which faces the mount member.

14. The semiconductor device as set forth in claim 8, wherein:
  each of the position/orientation lands has an outer peripheral portion which faces away from the center of the semiconductor package,
  each of the electrodes has an outer peripheral portion which faces away from the center of the semiconductor package, and
  the outer peripheral portion of each of the position/orientation lands is aligned substantially with the outer peripheral portion of a corresponding one of the position/orientation electrodes in a thickness direction of the semiconductor package.

* * * * *